US008344918B2

(12) United States Patent  (10) Patent No.: US 8,344,918 B2
Baudin et al.  (45) Date of Patent: Jan. 1, 2013

(54) PROCESS FOR DITHERING A TIME TO DIGITAL CONVERTER AND CIRCUITS FOR PERFORMING SAID PROCESS

(75) Inventors: Pierre Baudin, Grenoble (FR); Cyril Joubert, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 1304 days.

(21) Appl. No.: 12/027,696

(22) Filed: Feb. 7, 2008

(65) Prior Publication Data
US 2008/0297208 A1 Dec. 4, 2008

(30) Foreign Application Priority Data
Feb. 8, 2007 (FR) ...................................... 07 00889

(51) Int. Cl.
H03M 1/48 (2006.01)
(52) U.S. Cl. ........................................ 341/115; 341/118
(58) Field of Classification Search .................. 341/115, 341/166, 118, 131, 120; 327/159, 265, 107, 327/115, 117, 156; 375/376, 345
See application file for complete search history.

(56) References Cited

U.S. PATENT DOCUMENTS

| 7,570,182 | B2* | 8/2009 | Sheba et al. ................ | 341/118 |
| 2003/0141936 | A1 | 7/2003 | Staszewski et al. ............. | 331/16 |
| 2004/0066240 | A1 | 4/2004 | Staszewski et al. ............. | 331/36 |
| 2005/0195917 | A1 | 9/2005 | Staszewski et al. ........... | 375/295 |
| 2006/0103566 | A1 | 5/2006 | Vemulapalli et al. ......... | 341/155 |

FOREIGN PATENT DOCUMENTS
EP 1 443 653 8/2004

OTHER PUBLICATIONS

Staszewski, R.B., et al., "All-Digital Phase-Domain TX Frequency Synthesizer for Bluetooth Radios in 0.13 μm CMOS," ISSCC 2004/Session 15/Wireless Consumer ICs/15.3, 2004 IEEE International Solid-State Circuits Conference, 9 pages.

* cited by examiner

Primary Examiner — Joseph Lauture
(74) Attorney, Agent, or Firm — Seed IP Law Group PLLC

(57) ABSTRACT

A process inserts a random noise in a Time to Digital Converter (TDC) designed for calculating the phase error between a first high frequency signal $F_{DCO}$ with respect to a second reference signal, switching at a lower frequency. The process involves: processing of the first signal $F_{DCO}$ by using a chain of delays having a set of n elementary delays which number is chosen so as to extend over a full period of the first signal; storing the outputs of the chain of delays in a set of latches and generation of a thermometer code presenting a stream of "1" separated from a stream of "0" by a border corresponding to the transition of the first signal with respect to the second reference signal; reducing the thermometer code by a random number PN of bits; processing of the result in an edge detecting and thermometer code decoding so as to generate two variables $\Delta t_r$ and $\Delta t_f$ which are representative of the difference between the rise and fall time of the first signal with respect to the second reference signal; computing the normalized gain so as to generate an average value of $1/T_{DCO}$; adding to the value $\Delta t_r$ a binary value corresponding to the number of bits PN; multiplying the preceding result by the average value of $1/T_{DCO}$ and computing the phase error between the signals. The delay chain may be arranged with inverters. The process is particularly but not exclusively useful for carrying out a TDC convertor for the purpose of synthesizing of frequencies.

16 Claims, 9 Drawing Sheets

PROCESS FOR DITHERING A TIME TO DIGITAL CONVERTER AND CIRCUITS FOR PERFORMING SAID PROCESS

TECHNICAL FIELD

The present disclosure generally relates to processes and circuits for synthesizing frequencies, and more particularly but not exclusively to a process for dithering a Time to Digital Converter (T.D.C.).

BACKGROUND INFORMATION

Frequency synthesizing circuits are widely used in the architecture of electronic circuits, particularly in the field of telecommunications.

Usually, the problem involves producing a sinusoidal signal which has a frequency having a value which is equal to n times the value of a reference frequency, said frequency being assumed to be steady, such as generated by a quartz oscillator.

In such a situation, the frequency synthesis is achieved by using a Phase Locked Loop (P.L.L.) circuit and the recent general tendency is now to use fully digital architectures for embodying such circuits.

FIG. 1 illustrates a digital architecture of a known frequency synthesizer generating, at an output 6, a high frequency having a value $F_{DCO}$ from a reference frequency $F_{REF}$ which is ideally produced and inserted into an input 12 by a quartz based oscillator.

The synthesizer circuit uses a synchronous clock Fs available in the circuit, and which is generated by a latch having D and CK inputs respectively receiving the reference signal $F_{ref}$ and the output signal $F_{DCO}$.

A digital word used as a reference is introduced in an input 1 of a digital processing line comprising, in series, a phase accumulator 2, an adder 3 generating at its output an error signal $\Phi_E$, a loop filter 4 followed by a normalized oscillator 5 which generates on an output 6 the high frequency signal $F_{DCO}$.

The adaptive control of the values of the frequency as well as the phase of this signal $F_{DCO}$ is achieved by using two control loops which respectively process the integer and the fractional parts of the desired ratio n of the output frequency $F_{DCO}$ to the reference frequency $F_{REF}$.

The processing of the integer part is achieved by using a first control loop based on an accumulator 7 and its under-sampling latch 8 clocked by internal clock Fs which allows the counting of the number of rising edges of $F_{DCO}$ between two consecutive rising edges of the reference frequency signal $F_{REF}$.

The processing of the fractional part of ratio n is achieved by using a second control loop comprising a fractional phase error circuit 10, conventionally designated as a Time to Digital Converter (TDC). This TDC circuit comprises two inputs which respectively receive the reference clock $F_{REF}$ and the synthesized clock $F_{DCO}$, and which further generates at its output a digital word being representative of the phase error between the edges of the reference signal and the edges of the oscillator 5. The output signal of this fractional phase error circuit is transmitted to adder 3 in order to contribute to the error signal $\Phi_E$.

Such is one conventional use of a Time to Digital Converter (T.D.C.) circuit.

FIG. 3 illustrates a well-known embodiment of a TDC circuit, comprising a chain of delays—typically based on inverters 31-1 to 31-L (L being an integer representative of the number of inverting elements within the chain), each delay having an output being connected to an input of a corresponding latch 32-1 to 32-L. The delay chain is adapted so as to extend over a whole period of the high frequency signal $F_{DCO}$ and every latch 32-1 to 32-L receives at its clock input the reference signal $F_{REF}$.

The outputs of latches 32-1 to 32-L are concatenated in order to constitute one vector which is coded in accordance with a so-called "thermometer" code, which shows transitions between states "1" and states "0". This code is analyzed by an edge generating circuit which computes the values of the delays between rising edges ($\Delta tr$) and falling edges ($\Delta tf$), respectively on circuits 37 and 38, then transmitted to a normalized gain circuit 39 used for generating the value $1/T_{DCO}$ needed for computing the phase error:

$$\varepsilon = 1 - \frac{\Delta t_R}{T_{DCO}} = 1 - \frac{\Delta t_R}{2\,|\Delta t_R - \Delta t_F|}$$

and, applying the conventions shown in the chronogram of FIG. 5, the mean value of the period $T_{DCO}$ can be computed as follows:

$$\overline{T}_{DCO} = \frac{1}{N_{AVG}} \sum_{k=1}^{N_{AVG}} 2|\Delta t_R - \Delta t_F| \approx \frac{T_{DCO}}{t_{inv}}$$

The architecture of the frequency synthesizer which was briefly recalled above illustrates the situation of a fully digital implementation, with a PLL adaptive control loop mainly based on a TDC type circuit for achieving the fractional phase error processing 10.

Such a fully digital implementation presents a drawback resulting from the presence of limit cycles within the noise spectrum, as illustrated in FIG. 2.

Limit cycles result from the limitation of the resolution of oscillator 5, which limitation is derived from the quantification step used in the digital frequency synthesis. Because of this quantification step which determines the accuracy of the oscillator, the latter can only generate two neighboring frequencies having two respective values that are one quantification step part, but the same oscillator can certainly not produce any intermediate frequency with a value between those two respective values.

When the loop control becomes working, one can thus notice the appearance of jitter, that is to say the successive generation of two neighboring frequencies being one quantification step apart, and such jitter causes the appearance of parasitic lines as shown in FIG. 2, thus resulting in a non negligible quantification noise.

Such parasitic lines are particularly visible when the value of the output frequency $F_{DCO}$ is equal to n times (with n being an integer) the value of the frequency $F_{REF}$. In such a situation, one notices a maximum effect of the limit cycles, thus resulting in a non satisfactory quantification noise.

In order to reduce this quantification noise—or more precisely to mitigate its effects—some techniques are available in the art for canceling—or at least significantly reducing— the level of these parasitic lines. One gets then closer to the situation of a white noise. Such techniques for inserting random noise are conventionally designated as dithering techniques.

Generally speaking, known dithering techniques are difficult to embody and results in additional electronic circuits significantly jeopardizing the simplicity of the digital architecture.

Examples of techniques known in the art can be found in the following references:

Document "*All-Digital Phase-Domain TX Frequency Synthesizer for Bluetooth Radios in 0.13 pm CMOS*" by Staszewski et al, IEEE INTERNATIONAL SOLID STATE CIRCUITS CONFERENCE, 2004, Session 15, 272-273, describes a first known realization of a TDC circuit.

U.S. patent application Ser. No. 306,655 (U.S. Patent Application Publication No. 20030141936), filed on Nov. 27, 2002 by Staszewski et al., describes the architecture of a fully digital frequency synthesizer which is based on a digitally controlled oscillator (DCO), which is adjusted by means of a digital control word (OTW).

The patent application filed on Oct. 6, 2003 (U.S. Patent Application Publication No. 20040066240), by Staszewski et al., also describes a frequency synthesizer based on a digitally controlled oscillator.

All those known solutions involve the addition of a random shift at the level of the rising edges of the reference signal $F_{REF}$, so as to insert a random noise. On the other hand, the implementations show to be complex and particularly require significant changes at the level of every element composing the synthesizing circuit.

BRIEF SUMMARY

One embodiment provides an easier solution that allows a direct integration of a dithering technique within the TDC converter, so as to keep simple the architecture of the frequency synthesizing circuit.

One embodiment provides a simple implementation of a dithering process, directly within a Time to Digital converter.

One embodiment provides a TDC type converter which comprises a fully integrated mechanism for inserting a random noise.

One embodiment provides a frequency synthesizer which is easy to implement and which comprises a mechanism for inserting a random noise in order to embody a dithering function.

One embodiment achieves a low cost frequency synthesizing circuit which can be used for telecommunication equipment.

One embodiment provides a process for inserting a random noise in a Time to Digital Converter (TDC) designed for calculating the phase error between a first high frequency signal $F_{DCO}$ with respect to a second reference signal $F_{REF}$, switching at a lower frequency.

The process of one embodiment includes:
processing of the first signal $F_{DCO}$ by using a chain of delays comprising a set of n elementary delays which number is chosen so as to extend over a full period of said first signal;
storing the outputs of said chain of delays in a set of latches and generation of a thermometer code presenting a stream of "1" separated from a stream of "0" by a border corresponding to the transition of said first signal $F_{DCO}$ with respect to the second reference signal $F_{REF}$;
reducing said thermometer code by a random number PN of bits;
processing the result by edge detecting and thermometer code means so as to generate two variables, respectively $\Delta t_r$ and $\Delta t_f$ being representative of the difference between the rise and fall time of said first signal with respect to the second reference signal;
computing the normalized gain so as to generate an average value of $1/T_{DCO}$;
adding to the value $\Delta t_r$ a binary value corresponding to the number of bits PN;
multiplying the preceding result by the average value of $1/T_{DCO}$ and computing the phase error between the signals.

In one embodiment, the chain of delays is embodied by a set of inverters or, alternatively, by buffer type elements.

One embodiment also achieves one TDC type circuit comprising two inputs respectively receiving a first high frequency signal $F_{DCO}$ and a second reference signal $F_{REF}$ switching at a relatively lower frequency with respect to said first high frequency signal $F_{DCO}$, said second reference signal $F_{REF}$ generating at its output one digital word representative of the phase difference between the two signals.

The Time to Digital Converter of one embodiment comprises:
a delay line comprising a chain of delays having a number n of elements being Max(PN) higher than the length L required for covering a full period of said first signal $F_{DCO}$;
a set of latches, each allowing the storage of one corresponding element of said chain of delays so as to generate a thermometer code presenting a stream of "1" separated from a stream of "0" by a border corresponding to the transition of said first high frequency signal $F_{DCO}$ with respect to the said second reference signal $F_{REF}$;
means for cancelling in a random manner a number PN of bits, said number varying from 0 to MAX(PN);
edge detecting and thermometer decoding means for generating digital information $\Delta t_r$ and $\Delta t_f$ which are respectively representative of the shifts of the rising edges and the falling edges between said first high frequency signal $F_{DCO}$ and said second reference signal $F_{REF}$;
means for processing the information $\Delta t_r$ and $\Delta t_f$ so as to compute a normalized gain and generate the average value of the inverse of the period $T_{DCO}$ of said first signal;
means for adding to $\Delta t_r$ a binary value corresponding to the number of bits PN which was suppressed;
means for multiplying the preceding result by the average value of $1/T_{DCO}$ so as to generate a digital value ϵ which is representative of the phase error.

The process and the TDC circuit of one embodiment are particularly useful for achieving a frequency synthesizer comprising an improved TDC fitted with an dithering mechanism.

BRIEF DESCRIPTION OF THE SEVERAL VIEWS OF THE DRAWINGS

Other features of one or more embodiments will be made clear when reading the following description and drawings, only given by way of nonrestrictive examples. In the accompanying drawings.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

It will now be described a process in accordance with one embodiment which allows the insertion of random noise in the operation of a TDC type converter circuit.

The process described above can typically be applied to the synthesizing of one frequency, as useful in the field of telecommunication and particularly in the filed of mobile telecommunications. It should be noticed, however, that this is only one particular example of one possible use of the embodiment(s), and that the TDC converter described below may serve other different applications.

Figure 3:
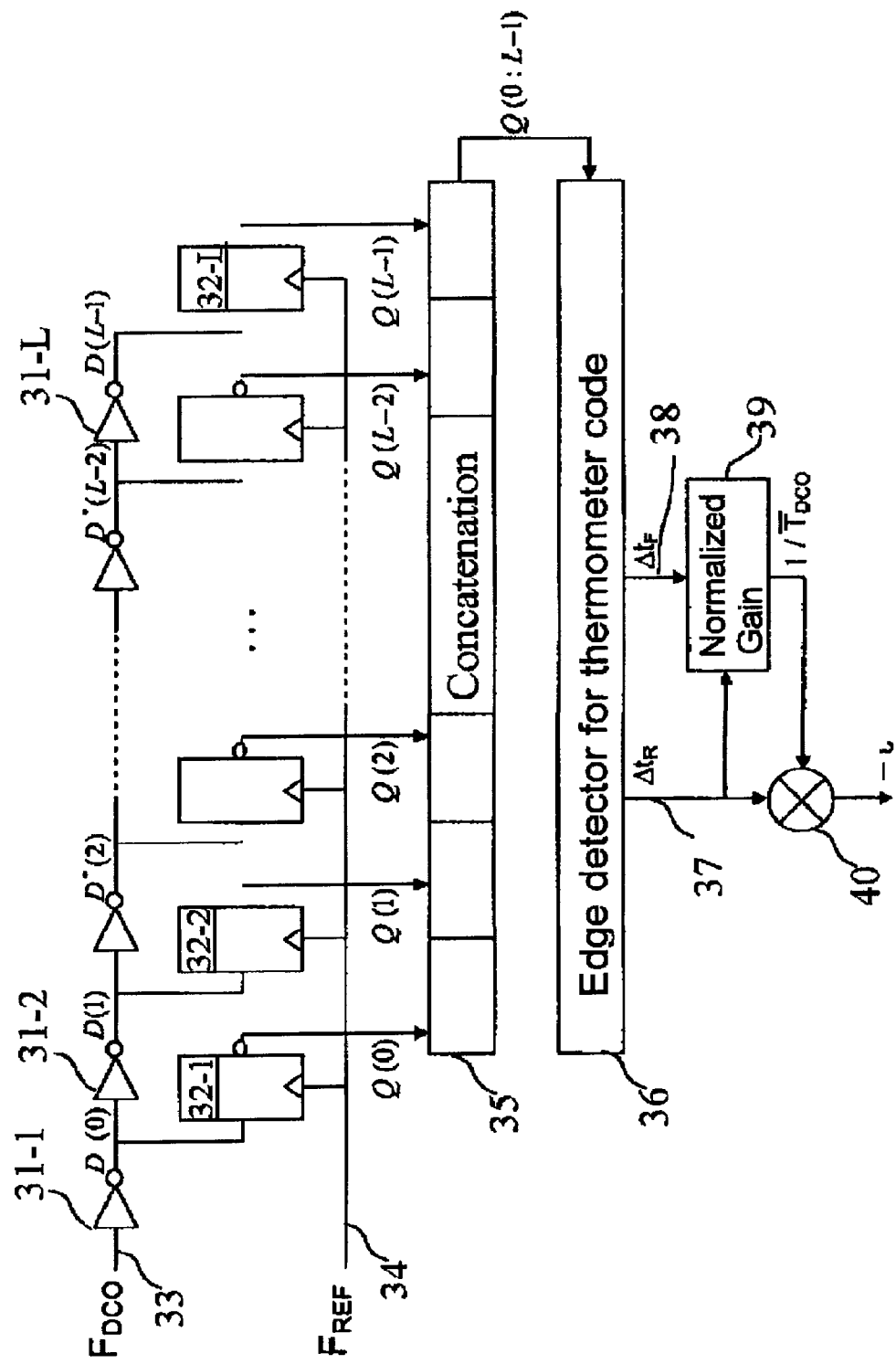
FIG. 3 illustrates a conventional TDC type circuit.
Figure 4:
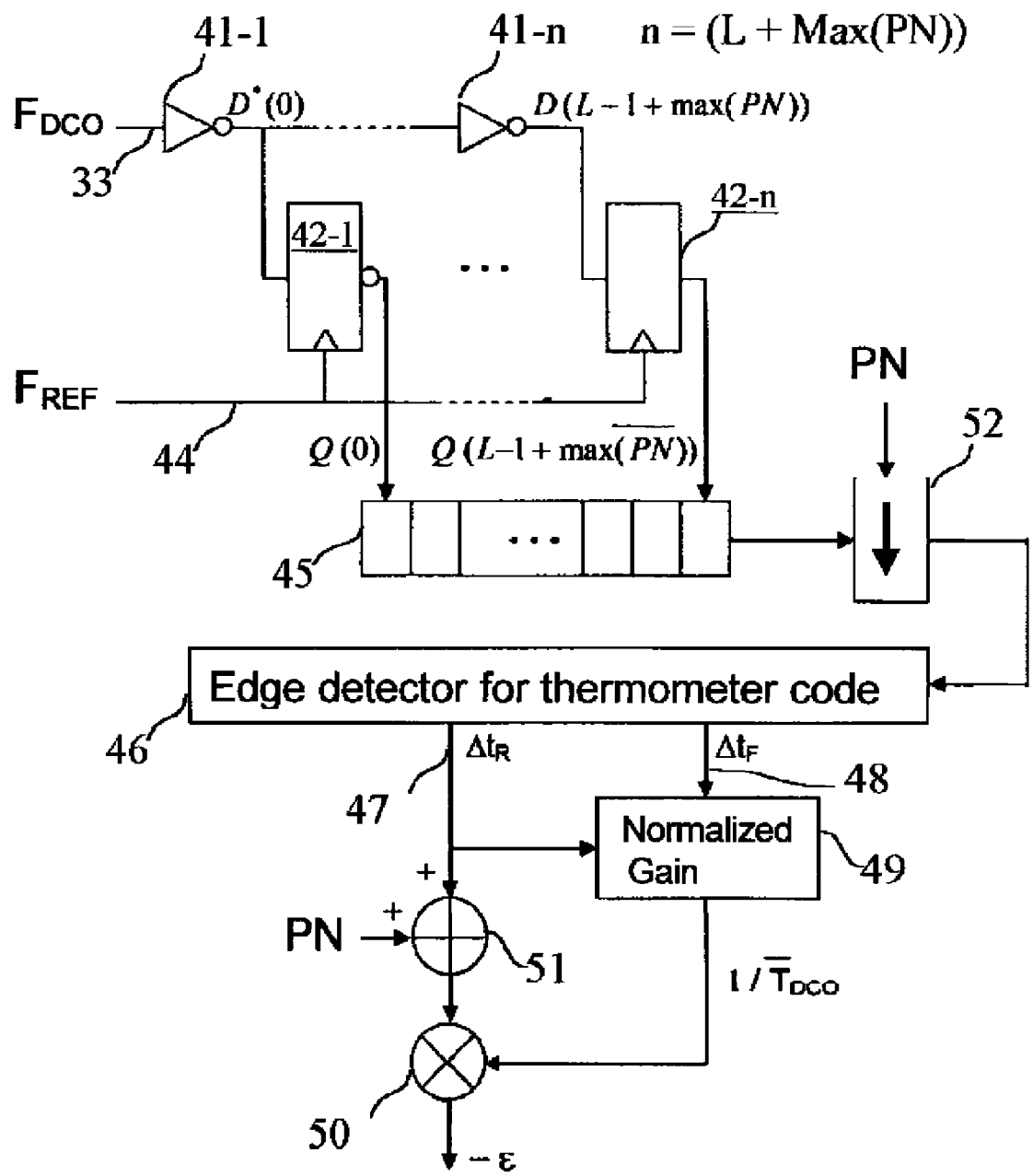
FIG. 4 illustrates one embodiment.
Figure 5:
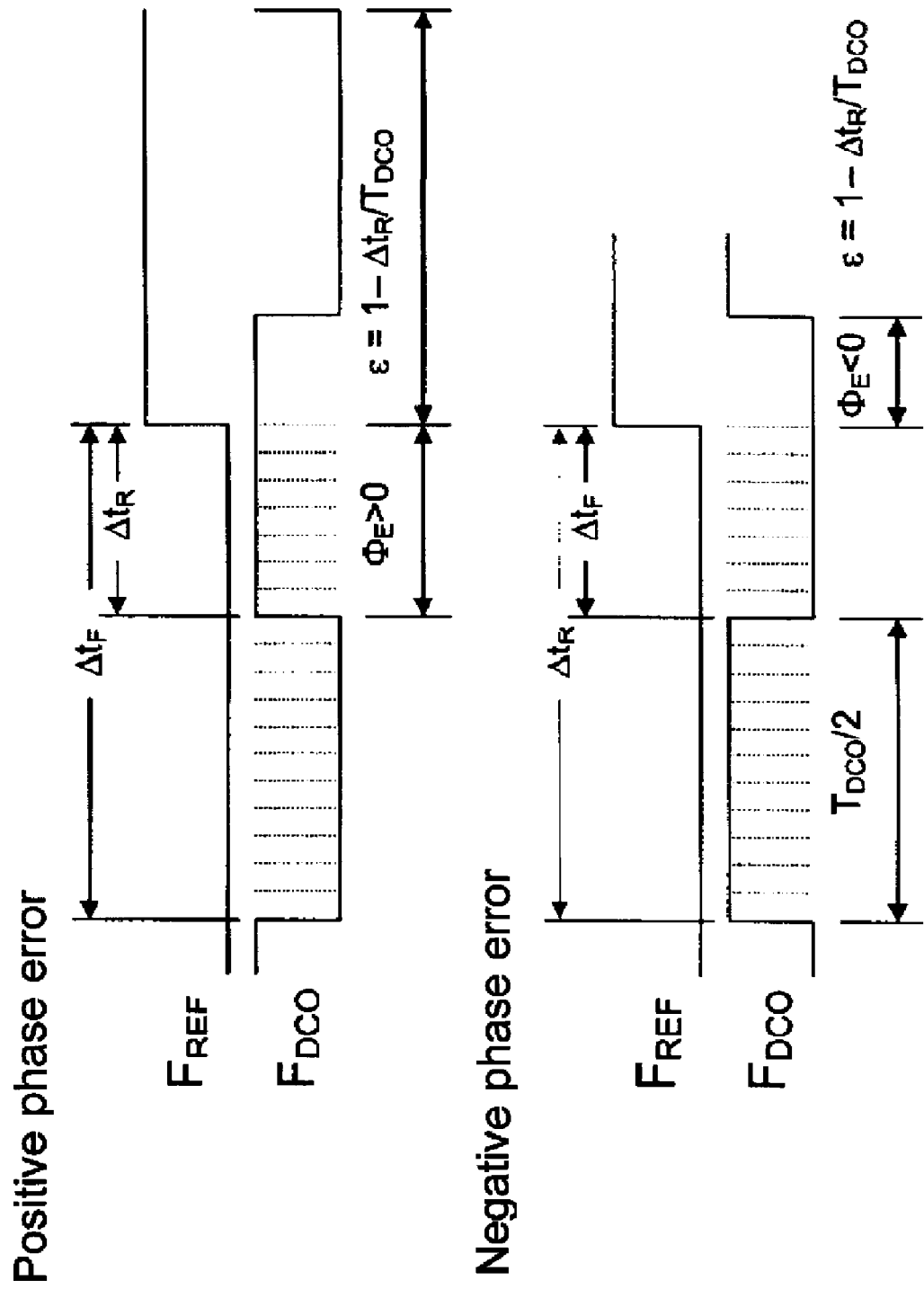
FIG. 5 illustrates chronograms of the reference clock $F_{ref}$ and the synthesized clock $F_{DCO}$ in both situations of phase advance and phase delay.

FIG. 4 illustrates one embodiment which is, for the sake of clarity, represented in a very similar way to the known circuit of FIG. 3, so as to better emphasize the new features which significantly improve the working of the circuit The circuit comprises a delay line which is based on a chain of inverters 41-1 to 41-n comprising a number of inverters which is higher than the number which was used in the known circuit of FIG. 3.

One has:

n>L, with L being chosen so as to ensure that the delay line formed of L elements extends over a full period of the high frequency signal $F_{DCO}$.

More precisely, the number of additional inverters (n-L) which are added to the known circuit (shown in FIG. 3) is determined so as to allow the extraction of a "window" of length L within the chain of length n, with multiples possibilities of random variations of the window extraction process.

One further notes that inverters 41-1 to 41-n could alternatively be embodied by buffers. An inverter shows the minimum delay since it is embodied with only two transistors and, for this reason, the processing chain 41-1 to 41-n may be embodied by inverters.

The output of each inverter 41-1 to 41-n—i.e., output D(0) to D(n)—is connected to one input of a D-type latch 42-1 to 42-n, each latch receiving at its clock input the reference frequency $F_{REF}$.

Consequently, each latch 42-1 to 42-n generates at its output one particularly bit, and all output of latches 42-1 to 42-n are concatenated in order to form one concatenated vector of length which is stored into a register 45 similar (at the difference of the length) to register 35 shown in FIG. 3. This vector takes the form of a thermometer code which having a sequence of "1" separated from a sequence of "0", and the border between the "1" and the '0" being representative of the transition of the synthesizing clock $F_{DCO}$.

The circuit according to one embodiment further distinguishes over the known circuit shown in FIG. 3. Indeed, a block 52 performs a reduction of PN bits of the thermometer coded word which is stored into register 45. In one particular embodiment, this is simply achieved by the elimination of PN first bits, with PN randomly varying between 0 to a value Max(PN). One thus obtains a word with a minimum length equal to L, which extends over the whole period of the signal $F_{DCO}$.

It should be noticed that the suppression of each bit results, because of the use of the thermometer code, of the insertion of a shift $\Delta t$.

In another embodiment, one may use a mechanism for extracting a sub-window, having a length equal to n–PN, within the initial concatenated vector of length n.

Once the "reduction" of the word loaded in the register 45 is completed, this information is processed by a block 46 which operates in a similar way than the known detector 36 illustrated in FIG. 3. Block 46 thus performs a detection of the edges, followed by a binary thermometer decoding, so as to generate digital values which are representative of the variables $\Delta t_r$ (difference between the rise time edges tr) and $\Delta t_f$ (difference between the fall time edges) between the two clocks $F_{REF}$ and $F_{DCO}$.

These variables $\Delta t_r$ and $\Delta t_f$ are then processed by a block 49 in order to compute the normalized gain in a similar manner than performed by block 39 of FIG. 3, so as to generated the mean value of $1/T_{DCO}$ Block 51 then performs the addition of the binary value PN to the value of $\Delta t_r$ so as to compensate for the reduction performed by block 52. One should further notice that a reduction of four bits performed by block 52 will have to be compensated by the addition of PN=4, coded on 3 binary encoded bits. The result of the addition of PN is then multiplied by the result of the information which is provided by block 49.

Ideally, the insertion of PN by block 51 allows to compensate for the reduction performed by block 52 on the thermometer code. However, such compensation is only theoretical since, in practice, there remain the effects of round errors resulting from the quantification step involved in the digital processing.

One takes notice that the round errors lead to the insertion of a random noise having a value which is inferior than the quantification step. One thus achieves, thanks to the simple use of the operations performed by blocks 51 and 52, the introduction of a fine shift of one signal with respect to the other, which value is inferior to the quantification step intrinsic to the TDC.

One thus achieves the same result than a second chain of delay, based on inverters which would present elementary delays being inferior than the quantification step of the main chain of delay 41-1 to 41-n.

Avoiding such second chain of delay is a significant advantage.

Figure 6:
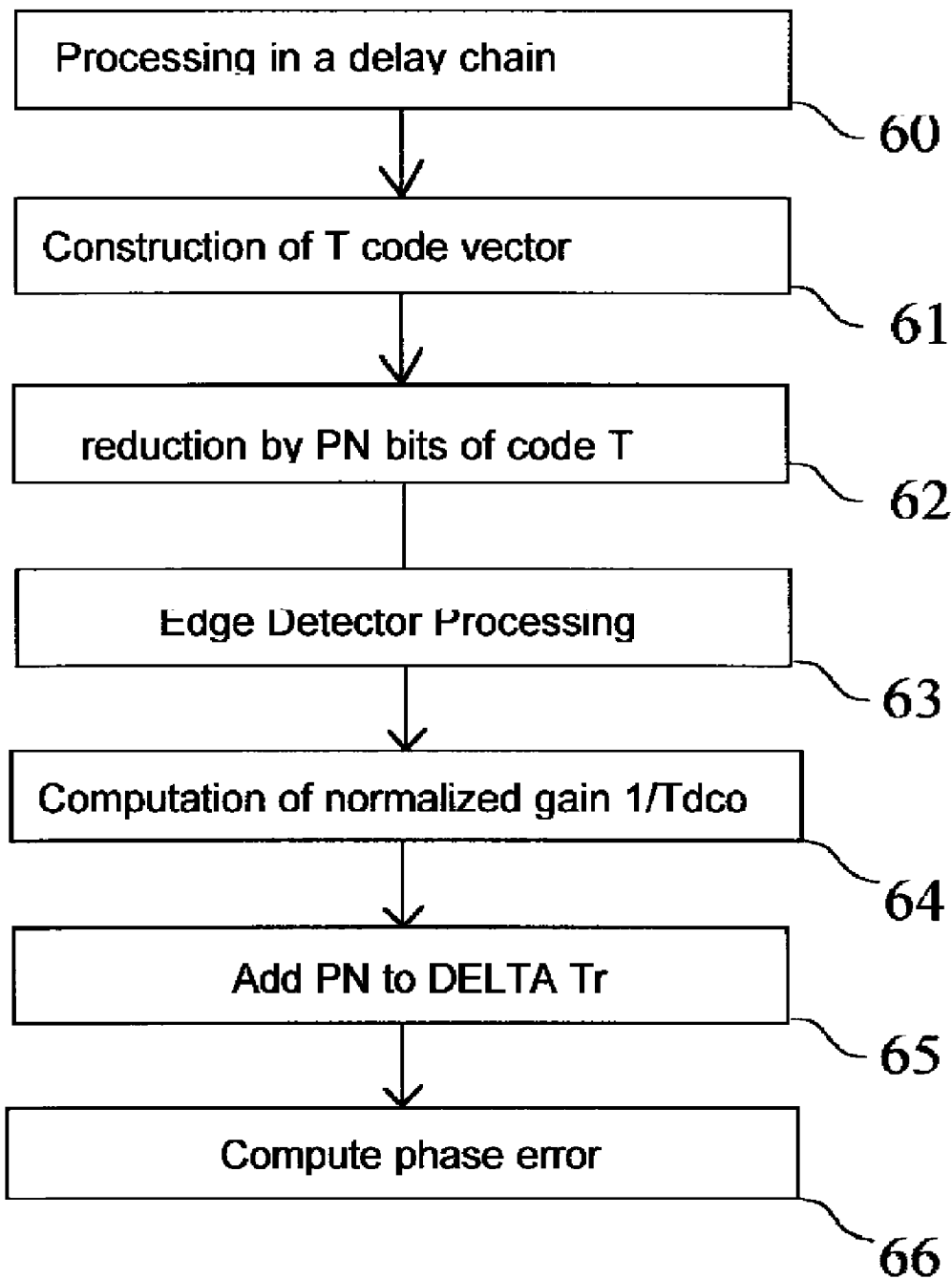
FIG. 6 illustrates a process for inserting a random noise in accordance with one embodiment.

FIG. 6 illustrates the different phases of one embodiment of the process which achieves the insertion of a random noise within the working of the Time to Digital Converter which is used for generating a digital information being representative of the phase difference between a reference frequency $F_{REF}$ and a synthesized frequency $F_{DCO}$ The process starts with a step 60 comprising the processing of signal $F_{DCO}$ by a chain of delay having a length n and which comprises a set of n elementary delays, the number of which being chosen so as to extend over a full period of the first signal.

The process then proceeds with a step 61 which stores the output of every component composing the chain of delays into a corresponding set of latches, at the rhythm of a reference clock $F_{REF}$ so as to generate a thermometer code which presents a sequence of "1" separated by a sequence of "0", the border of which corresponding to the transition of the first signal with respect to the second reference signal.

In a step 62, the process proceeds with a random reduction of PN bits of the thermometer code which was generated in step 61.

In a step 63, the resulting thermometer code is transmitted to an edge detector so as to generate variables $\Delta t_r$ and $\Delta t_f$ being representative of the phase difference between the two frequencies.

Because of the reduction by PN of the number of bits, the edge detector causes the determination of the following variables $\Delta t_r^{dith}$ in accordance with the formula:

$$\Delta t_R^{dith} = (\Delta t_R - PN) \bmod [T_{DCO}/t_{inv}]$$

In a step 64, the process computes the normalized gain from the two variables $\Delta t_r$ and $\Delta t_f$ so as to calculate the average value of $1/T_{DCO}$.

In a step 65, the process adds the value PN to the variable $\Delta t_r$.

In a step 66, the process compute the phase error from the result of steps 64 and 65 in accordance with the formula:

$$\varepsilon = 1 - \left(\frac{\Delta t_R^{dith} + PN}{\overline{T}_{DCO}}\right) \bmod[1]$$

The process which was described above provides a significant technical effect which is equivalent to that resulting from the use of a second chain of delays having a quantification step being inferior than the main step. This advantage results from the combination of different steps—the shift operation, the calculation of the normalized gain and the addition again of PN—which all together cause the insertion of computing errors due to the quantification step thus resulting in noise as if, by analog circuitry, one had use a shift being lower than the quantification step.

One thus simply achieves the dispersion of the quantification noise and thus significantly reduces the presence of parasitic lines.

Figure 7A:
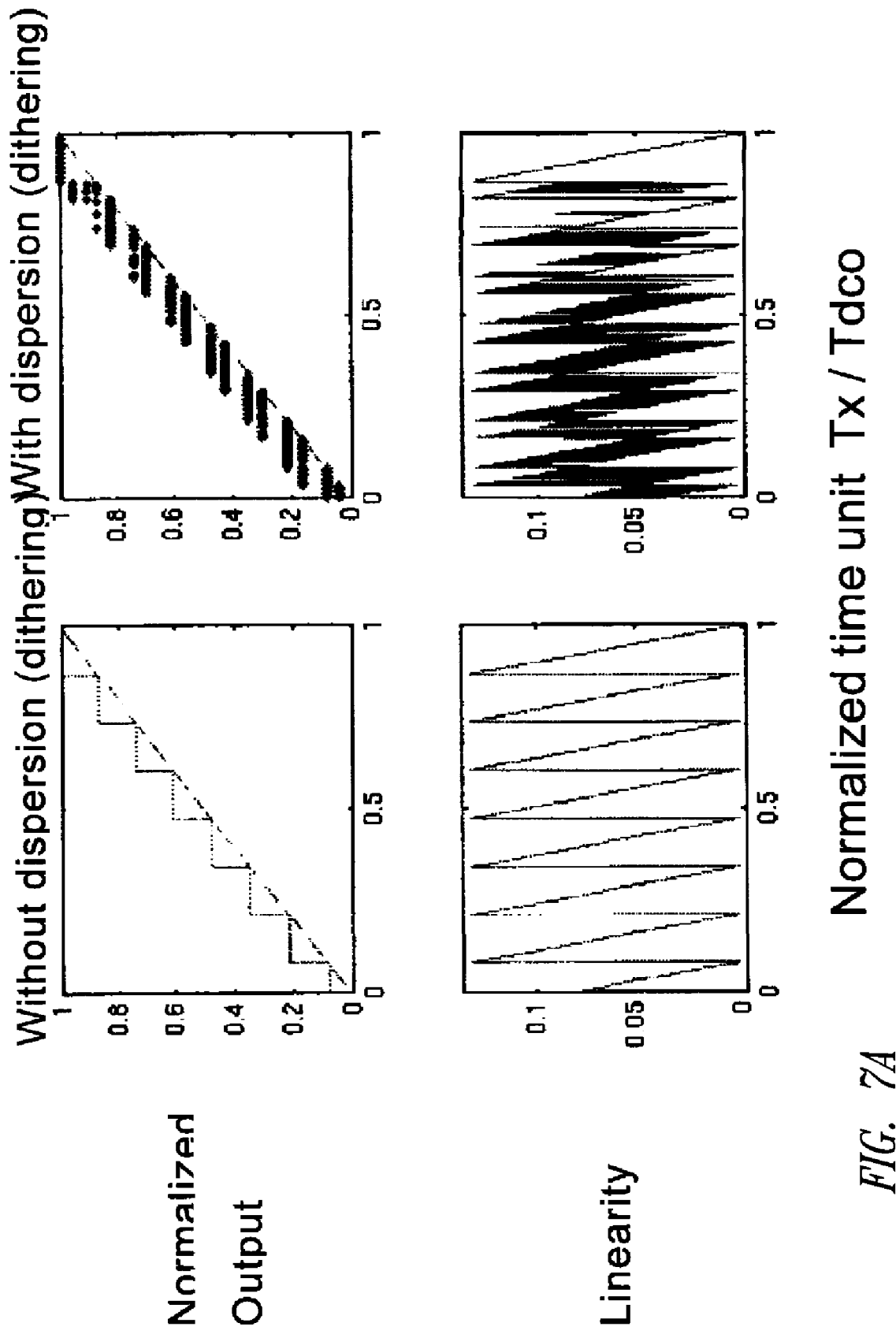
FIG. 7A illustrates comparative curves representative of the linearity and of the normalized output of the TDC converter, with and without the use of the process of one embodiment.
Figure 7B:
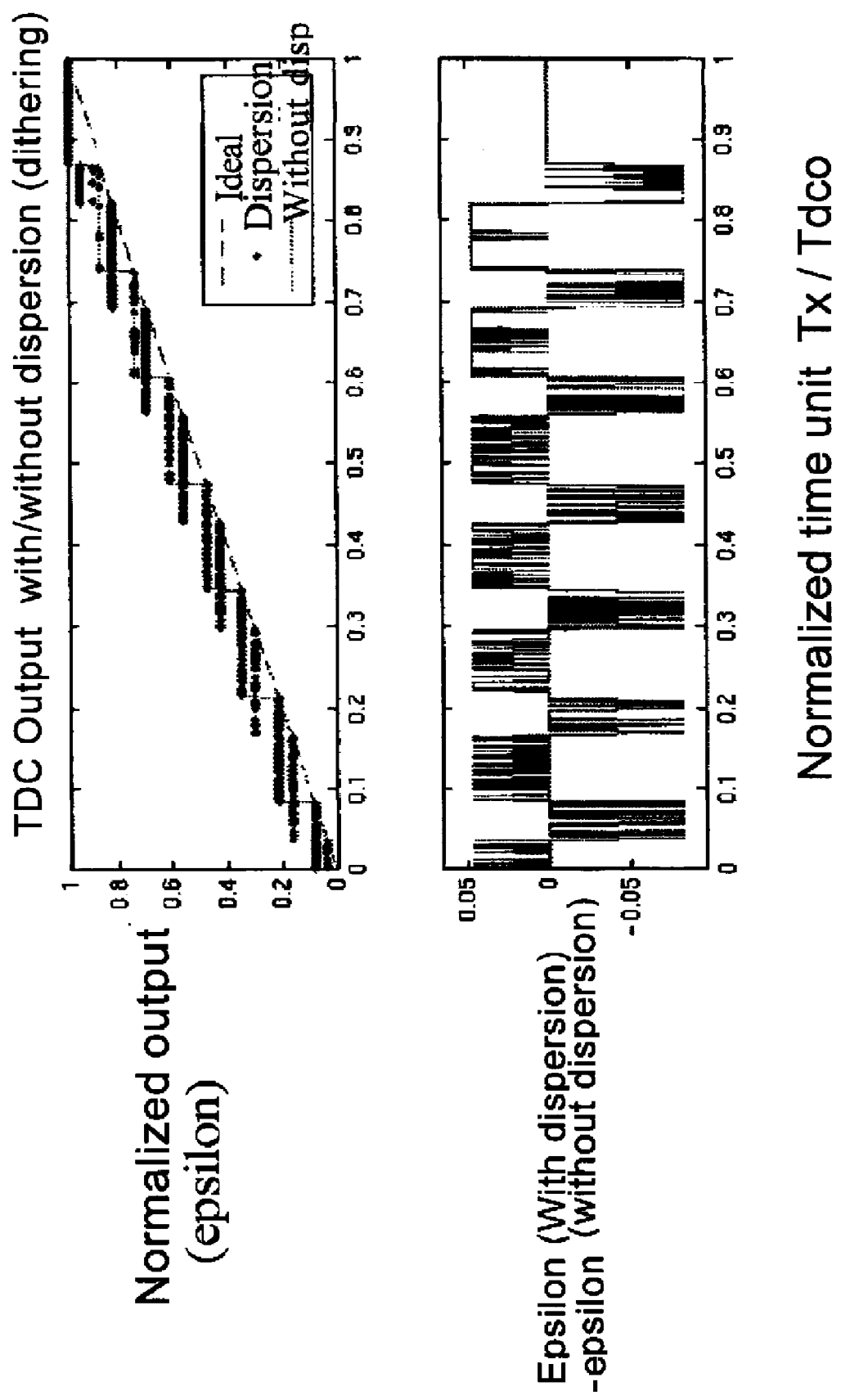
FIG. 7B illustrates comparative curves of the normalized output of the TDC converter, with and without the use of the process of one embodiment.

FIGS. 7A and 7B illustrate the effect of the process according to one embodiment. FIG. 7A illustrates comparative charts representative of the linearity as well as the normalized output of the TDC converter, which and without the use of the process of one embodiment. FIG. 7B illustrates comparative diagrams of the normalized output of the TDC converter, with and without the use of the process of one embodiment. One may see, with the process, the appearance of intermediate quantification steps.

Figure 8:
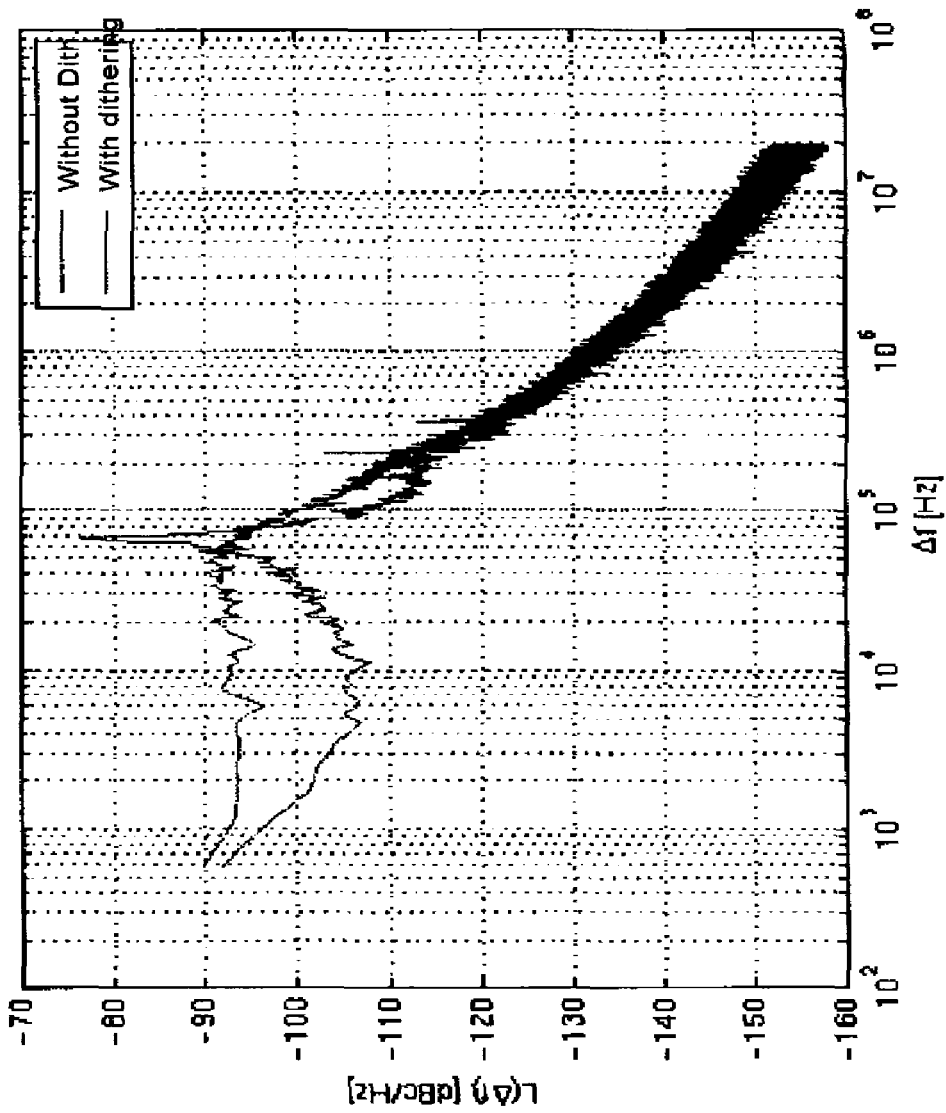
FIG. 8 shows the effect of the process of one embodiment on the spectrum of the phase noise.

FIG. 8 illustrates the effect of the use of the process of one embodiment on the spectrum of the phase noise and one may observe a significant reducing of that the parasitic lines which are representative of limit cycles.

The converter which was described shows to be particularly useful for achieving a frequency synthesizer which shall now be described, for the sake of clarity, with respect to elements illustrated in FIG. 1. For that purpose, one may combine the Time to Digital Converter which was described above a digital processing chain similar to the one illustrated in FIG. 1, which comprises, in series, a phase accumulator 2, an adder 3 generating an error signal $\Phi_E$, a loop filter 4 and an oscillator 5 for generating on an output 6 said high frequency signal $F_{DCO}$.

Figure 1:
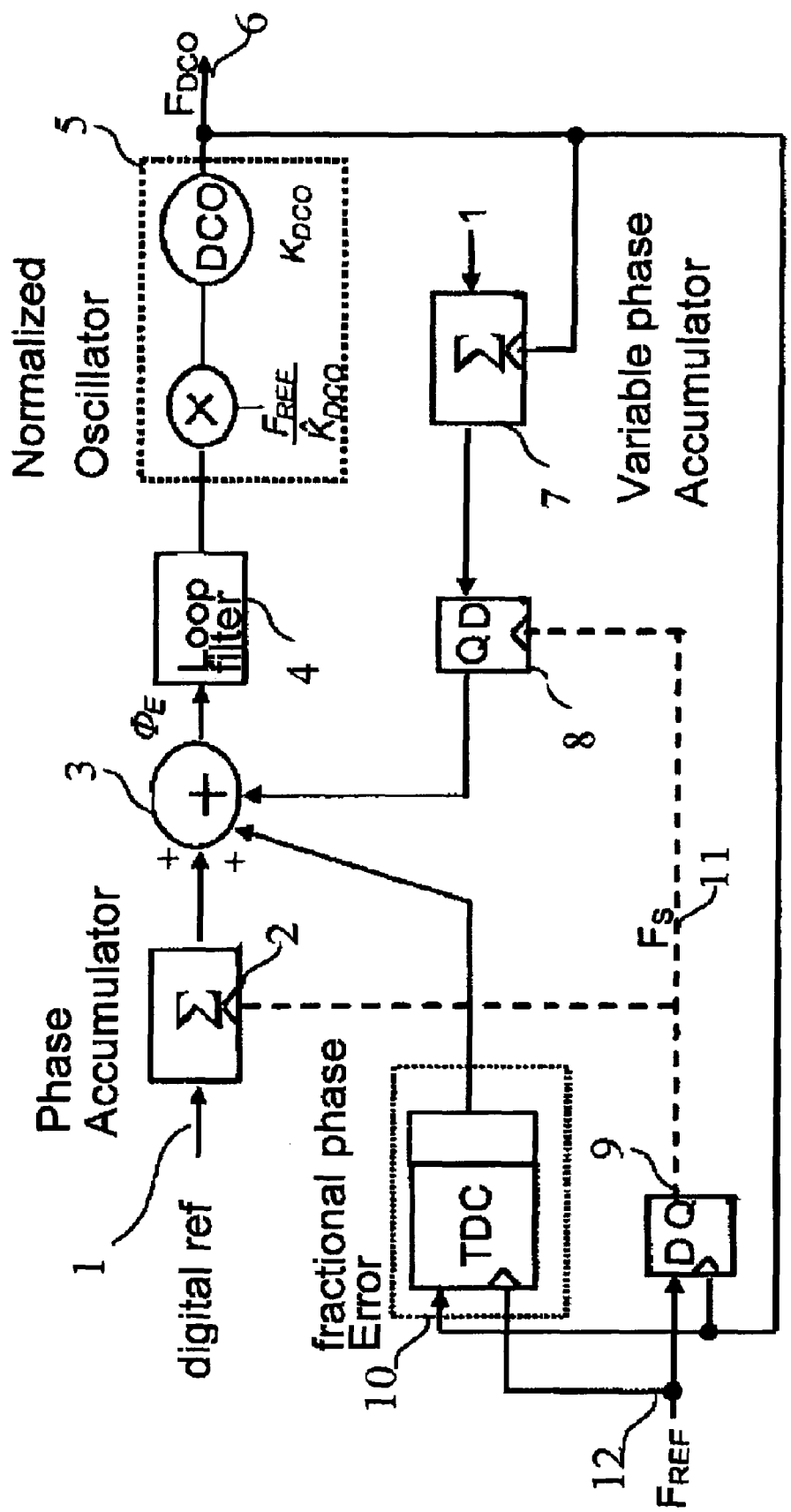
FIG. 1 illustrates a known architecture of a fully digital frequency synthesizer.
Figure 2:
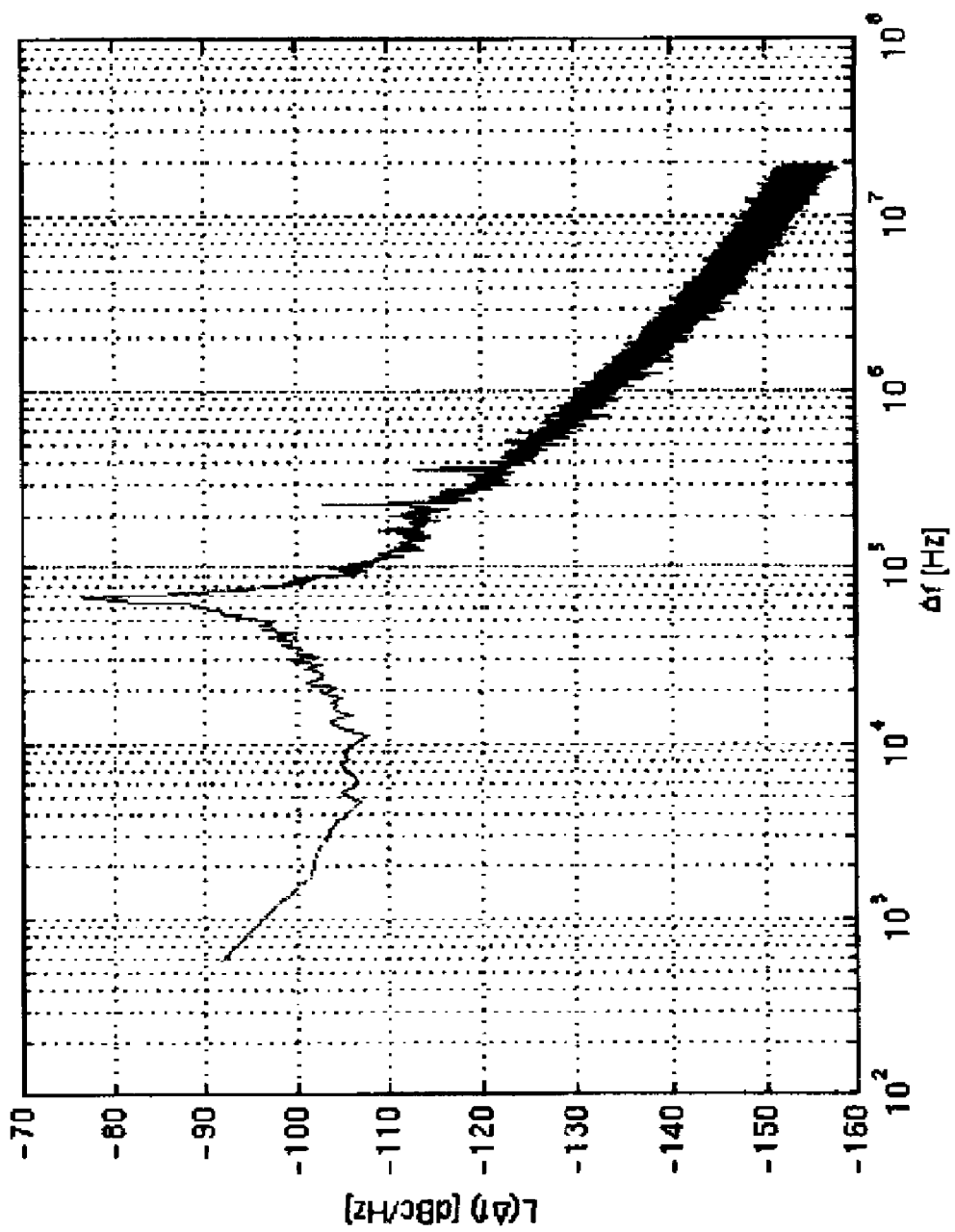
FIG. 2 illustrates the appearance of limit cycles.

For the purpose of respectively processing the integer part and the fractional part of the desired ratio n of the output frequency $F_{DCO}$ to the reference frequency $F_{REF}$, one combines a first and a second control loop, the first loop being similar to the one existing in the circuit known in the art which is illustrated in FIG. 1.

The second control loop comprises a Time to Digital Converter having:

a delay line comprising a chain of delays (41-1, 41-n) comprising a number n of elements being Max(PN) higher than the length L required for covering a full period of the high frequency signal $F_{DCO}$;

a set of latches (42-1, 42-n), each allowing the storage of one corresponding element of said chain of delays so as to generate a thermometer code presenting a stream of "1" separated from a stream of "0" by a border corresponding to the transition of said high frequency $F_{DCO}$ with respect to the said reference frequency;

means (52) for cancelling in a random manner a number PN of bits, said number which may vary from 0 to MAX(PN);

edge detecting and thermometer decoding means for generating digital information $\Delta t_r$ and $\Delta t_f$ which are respectively representative of the shifts of the rising edges and the falling edges between said high frequency signal $F_{DCO}$ and said reference frequency;

means (49) for processing the information $\Delta t_r$ and $\Delta t_f$ so as to compute a normalized gain and generate the average value of the inverse of the period $T_{DCO}$ of said first signal;

means (51) for adding to $\Delta t_r$ a binary value corresponding to the number of bits PN which was suppressed;

means (50) for multiplying the preceding result by the average value of $1/T_{DCO}$ so as to generate a digital value $\varepsilon$ which is representative of the phase error.

The frequency synthesizing circuit will not be described further since a skilled man will directly embody the converter which was described above to the architecture which was illustrated in FIG. 1.

It should be noticed, however, that the application which is considered, namely the processing of a fractional part of a Phase Locked Loop (P.L.L.) circuit, the TDC circuit generates a digital value $\varepsilon$ which is representative of the phase error between the reference clock $F_{REF}$ and the synthesized frequency $F_{DCO}$. In one embodiment, the code is representative of the number of quantization steps for the fractional part. Thus, for a two-bits code, there is four quantification steps, what allows the coding of the following values: 0, 0.25, 050, 075.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A process to insert a random noise in a time to digital converter designed to calculate a phase error between a high frequency first signal with respect to a reference second signal, switching at a lower frequency, said process comprising:

processing the first signal $F_{DCO}$ by using a chain of delays having a set of n elementary delays which number n is chosen so as to extend over a full period of said first signal;

storing outputs of said chain of delays in a set of latches and generating a thermometer code presenting a stream of 1s separated from a stream of 0s by a border corresponding to a transition of said first signal with respect to the second reference signal;

reducing said thermometer code by a random number of bits;

processing result in an edge detecting and thermometer code decoding so as to generate two variables $\Delta t_r$ and $\Delta t_f$, the variable $\Delta t_r$ being representative of a difference between a rise time of said first signal with respect to a rise time the second signal and the variable $\Delta t_f$ being representative of a difference between a fall time of said first signal with respect to a fall time of the second signal;

computing a normalized gain so as to generate an average value of $1/T_{DCO}$, wherein $T_{DCO}$ is a period of said first signal;

adding to a value $\Delta t_r$ a binary value corresponding to the random number of bits; and multiplying a preceding result by an average value of $1/T_{DCO}$ and computing a phase error between the first and second signals.

2. The process according to claim 1 wherein said chain of delays includes inverters.

3. The process according to claim 2 wherein said chain of delays includes buffers.

4. The process according to claim 1 wherein said process is adapted to synthesize a frequency in a communication system.

5. A time to digital converter circuit having two input terminals respectively adapted to receive a high frequency first signal and a reference second signal, which switches at a relatively lower frequency, said circuit being adapted to generate at its output terminal one digital word representative of a phase difference between the first and second signals, said circuit comprising:

a delay line having a chain of delays including a number n of elements being Max(PN) higher than a length L that covers a full period of said first signal;

a set of latches, each adapted to store a respective output value of a corresponding element of said chain of delays so as to generate a thermometer code presenting a stream of 1s separated from a stream of 0s by a border corresponding to a transition of said first signal with respect to said second reference signal;

means for cancelling in a random manner a number PN of bits, said number PN of bits being variable from 0 to MAX(PN);

edge detecting and thermometer decoding means for generating digital information $\Delta t_r$ and $\Delta t_f$, the variable $\Delta t_r$ being representative of a difference between rising edges of said first and second signals and the variable $\Delta t_f$ being representative of a difference between falling edges of said first and second;

means for processing the information $\Delta t_r$ and $\Delta t_f$ so as to compute a normalized gain and generate an average value of an inverse of a period $T_{DCO}$ of said first signal;

means for adding to $\Delta t_r$ a binary value corresponding to the number PN of bits; and means for multiplying a preceding result by the average value of $1/T_{DCO}$ so as to generate a digital value which is representative of the phase difference.

6. The circuit according to claim 5 wherein said chain of delays is arranged with inverters.

7. The circuit according to claim 5 wherein said chain of delays is arranged with buffers.

8. A frequency synthesizing circuit for generating a high frequency signal from a reference frequency signal, the circuit comprising:

means for generating a frequency signal that is synchronous with a frequency of said reference frequency signal;

a digital processing chain having, in series, one phase accumulator, one adder adapted to generate an error signal, one loop filter, and one oscillator adapted to generate at its output terminal said high frequency signal;

frequency and phase adaptive control means for controlling said high frequency signal and having first and second control loops for respectively processing an integer part and a fractional part of a desired ratio of an output frequency of the high frequency signal to the frequency of the reference frequency signal;

a time to digital converter configured to process the fractional part and including:

a delay line having a chain of delays that include a number n of elements that are Max(PN) higher than a length that covers a full period of said high frequency signal;

a set of latches, each adapted to store a respective output of one corresponding element of said chain of delays so as to generate a thermometer code presenting a stream of 1s separated from a stream of 0s by a border corresponding to a transition of said high frequency signal with respect to said reference frequency signal;

means for cancelling in a random manner a number PN of bits, said number which may vary from 0 to MAX (PN);

edge detecting and thermometer decoding means for generating digital information $\Delta t_r$ and $\Delta t_f$, the variable $\Delta t_r$ being representative of a shift of rising edges of said high frequency signal and said reference frequency signal and the variable $\Delta t_f$ being representative of a shift falling edges of said high frequency signal and the reference frequency signal;

means for processing the information $\Delta t_r$ and $\Delta t_f$ so as to compute a normalized gain and generate an average value of an inverse of a period $T_{DCO}$ of said high frequency signal;

means for adding to $\Delta t_r$ a binary value corresponding to the number PN of bits; and means for multiplying a preceding result by the average value of $1/T_{DCO}$ so as to generate a digital value which is representative of a phase error between said high frequency and reference frequency signals.

9. The frequency synthesizing circuit according to claim 8 wherein said first control loop includes an accumulator having a sampling clock input pulsed by an internal clock.

10. The frequency synthesizing circuit according to claim 8 wherein said chain of delays includes a plurality of inverters.

11. The frequency synthesizing circuit according to claim 8 wherein said chain of delays includes a plurality of buffers.

12. A time to digital converter apparatus, comprising:
first and second input terminals respectively adapted to receive a first signal and a reference signal, which switches at a lower frequency relative to said first signal;
a delay line coupled said first input terminal to receive said first signal and having a chain of n delay elements, n being higher than a length that covers a full period of said first signal;
a set of latches coupled to said second input terminal to receive said reference signal and respectively coupled to said delay elements, each of said latches being adapted to store a corresponding output of said delay elements so as to generate a thermometer code presenting a stream of 1s separated from a stream of 0s by a border corresponding to a transition of said first signal with respect to said reference signal;
a first block adapted to cancel a number PN of bits of said thermometer code;

a second block coupled to the first block and adapted to detect edges and decode said thermometer code to generate digital information $\Delta t_r$ and $\Delta t_f$, the variable $\Delta t_r$ being representative of a difference between rising edges of said first and reference signals and the variable $\Delta t_f$ being representative of a difference between falling edges of said first and reference signals;

a third block coupled to said second block and adapted to process the information $\Delta t_r$ and $\Delta t_f$ so as to compute a normalized gain and to generate an average value of an inverse of a period $T_{DCO}$ of said first signal;

a fourth block coupled to said second block and adapted to add to $\Delta t_r$ a binary value corresponding to the number PN of bits; and a fifth block coupled to said fourth and third blocks and adapted to multiply a preceding result by the average value of $1/T_{DCO}$ so as to generate a digital value which is representative of a phase difference between said first and reference signals.

13. The apparatus of claim 12 wherein said chain of delay elements includes a plurality of inverters.

14. The apparatus of claim 12 wherein said chain of delay elements includes a plurality of buffers.

15. The apparatus of claim 12, further comprising a register coupled to said set of latches and adapted to store said thermometer code, and coupled to said first block to provide said thermometer code thereto to have said number PN of bits canceled by said first block from said thermometer code.

16. The apparatus of claim 12 wherein clock input terminals of said set of latches are coupled to said second input terminal to receive said reference signal.

\* \* \* \* \*